United States Patent [19]

Begg

[11] Patent Number: 4,523,187

[45] Date of Patent: Jun. 11, 1985

[54] ALARM SYSTEM FOR ELECTRIC FENCES

[75] Inventor: Geoffrey S. Begg, Heidelberg, Australia

[73] Assignee: Norman W. Hutchinson & Sons PTY. Ltd., South Melbourne, Australia

[21] Appl. No.: 375,270

[22] PCT Filed: Jul. 27, 1981

[86] PCT No.: PCT/AU81/00123

§ 371 Date: Apr. 20, 1982

§ 102(e) Date: Apr. 20, 1982

[87] PCT Pub. No.: WO82/00936

PCT Pub. Date: Mar. 18, 1982

[30] Foreign Application Priority Data

Aug. 29, 1980 [AU] Australia ............................. 5330/80

[51] Int. Cl.$^3$ ...................... H05C 3/00; G08B 23/00; G01R 19/00

[52] U.S. Cl. ................................. 340/661; 324/51; 256/10; 340/650; 340/652; 340/540

[58] Field of Search .............. 256/10; 340/540, 660, 340/661, 662, 663, 664, 650, 651, 652, 564; 324/52 FF, 52 O, 140 R

[56] References Cited

U.S. PATENT DOCUMENTS

| | | | |
|---|---|---|---|
| 3,031,643 | 4/1962 | Shettelmen | 340/564 X |
| 3,293,630 | 12/1966 | McKaig | 340/662 |
| 3,564,528 | 2/1971 | Drushel | 340/660 X |
| 3,778,801 | 12/1973 | Nudelmant | 340/651 X |
| 3,831,160 | 8/1974 | Cronin et al. | 340/661 X |
| 3,873,847 | 3/1975 | Finch et al. | 307/132 R X |
| 4,065,758 | 12/1977 | Barbier et al. | 340/661 X |
| 4,220,949 | 9/1980 | Pope et al. | 256/10 X |
| 4,297,633 | 10/1981 | McCutchen et al. | 340/651 X |
| 4,318,088 | 3/1982 | Hunter | 256/10 X |
| 4,321,643 | 3/1982 | Vernier | 340/652 X |

FOREIGN PATENT DOCUMENTS

| | | | |
|---|---|---|---|
| 502328 | 8/1977 | Australia . | |
| 503786 | 8/1977 | Australia . | |
| 509325 | 3/1979 | Australia . | |
| 2458078 | 1/1981 | France | 340/650 |

OTHER PUBLICATIONS

"Voltage Detection Circuit"; IBM Technical Disclosure Bulletin, vol. 3, No. 6, p. 37; 11-1960; F. L. O'Malley.

Primary Examiner—Stewart J. Levy
Assistant Examiner—Tom Noland
Attorney, Agent, or Firm—Erwin S. Teltscher

[57] ABSTRACT

A monitoring system for use with an electrified fence and an energizer (21) therefor, monitoring system being adapted to determine the effectiveness of electric pulses applied to the fence by the energizer (21) and including a voltage sensing device (10) for sensing the voltage of the pulse applied to the fence conductor, a current sensing device (12) for sensing the current in the fence conductor and monitoring device (14) (16) (17) (20) for monitoring signals related to the current and voltage whereby the monitoring device (14) (16) (17) (20) operates an alarm (18) and/or indicates a reading on an indicator (15) when the monitored signals fall outside predetermined ranges of values indicative of lack of fence effectiveness.

7 Claims, 5 Drawing Figures

ALARM SYSTEM FOR ELECTRIC FENCES

BACKGROUND OF THE INVENTION

1. Field of the Invention

The present invention relates to improvements in electric fencing monitoring systems, particularly for multiple fence arrangements of relatively long lengths.

2. Description of Prior and Related Art

Electric fences utilizing an energizer at one end for producing a pulse along the length of the fence have been known for many years and are presently being used more frequently due to a more general awareness of their advantages over conventional fences. The pulse generated is of such a level and frequency that it will deter passage of animals and the like through the fence. The advantages of electric fences are particularly significant in farm fencing arrangements where temporary paddocks are desired and electric fences are becoming more extensively used for this purpose.

Electric fences permit a simpler, lighter and therefore cheaper construction than conventional fences as there is no longer any need to make design allowances for animals endeavouring to push through the fence to get to pastures on the other side.

However, problems do arise if a power loss of a certain dimension, or a complete power loss occurs along the fence; because of the light construction of the fence stock losses through the fence can occur or damage to crops can result from intrusion of ones own stock or foreign animals into crop growing areas. Therefore there is a need for some means of simply determining when a fault occurs along a conductor of a sufficiently significant nature to make the conductor ineffective for its design purpose and when such fault occurs an alarm is raised.

Some proposals have been made for alarm systems for these types of fences, however, these have generally been complex or ineffective in operation, particularly for fences of considerable length. An electric fence system suitable for lengthy systems has been proposed by us as described in our published Australian patent application No. 509,325. This system operates with a monitoring device including an alarm and a reflector means in the fence which reflects pulse signals to the monitoring device which will activate the alarm if the pulses are absent or are weak. This system has been used in the field and found to work satisfactorily. The present invention aims to remove the need for providing a reflector device in an electric fence alarm system and yet operates effectively.

SUMMARY OF THE INVENTION

There is provided according to the present invention a monitoring system for an electric fence having an energizer means for applying an electric pulse to a fence conductor, said system comprising means for sensing the voltage of said pulse in said conductor, means for sensing the current in the conductor, the value of current and voltage being related to the magnitude of said pulse and ambient conditions at the conductor, monitoring means for computing signals related to said current and voltage and adapted to operate alarm means when the computed signal falls outside a predetermined range of values or to indicate a reading on indicator means.

Conveniently said monitoring means includes means for detecting a rapid fall in current level (as may be caused by a breakage) whereby said alarm or indicator means is activated. Said monitoring means includes means for measuring or detecting a rise or fall in current level (as may be caused by an unacceptable drop in potential in the fence through insulator breakdown or moisture leads to earth) whereby said alarm is activated in the case of rise beyond predetermined limits. Additionally or alternatively an indicator is provided to give a reading of current levels at any given moment in operation.

BRIEF DESCRIPTION OF THE DRAWING

The invention will be described in greater detail having reference to the accompanying circuit diagrams in which.

DESCRIPTION OF THE PREFERRED EMBODIMENTS

The fence and energizer construction may be of conventional type and of course may take many forms as is known in the art. For example the fence may be either a single wire energized with respect to the earth or many wires so energized. The fence may also consist of a wire or wires connected to the earth together with the insulated active wire or wires.

Figure 1:
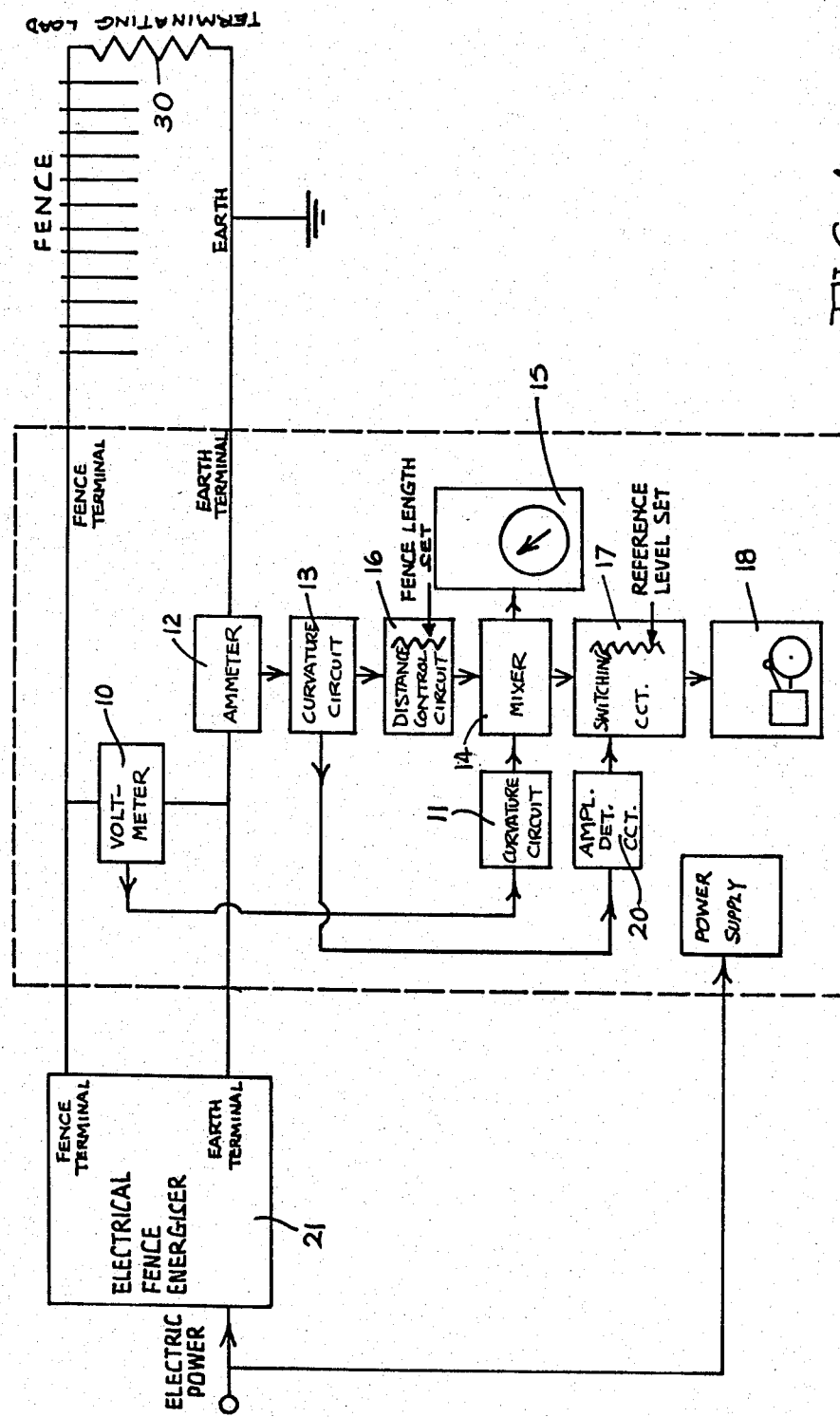
FIG. 1 is a schematic block diagram of an electric fence circuit.

Referring to FIG. 1, the voltage of each pulse emitted by the energizer 21 is measured by volt meter 10 and is modified or linearized by curvature circuit 11. The current in the earth return to the energizer is measured by ammeter 12 which in turn is linearized by curvature circuit 13. The linearized values of the voltage and current are received by a mixing circuit 14 to give an output measured by the indicating device 15. The indicating device 15 gives at any instant a measurement of the apparent voltage level at the remote end of the fence although the monitoring device is connected into line in juxtaposition with the energizer.

In operation the linearized current signal is fed into a distance control circuit 16 which includes a potentiometer whose resistance has been set according to the length of the fence such that under certain conditions given similar voltage pulses the indicating device will indicate the same value as a voltmeter reading taken at the remote end of the fence. Thus where there is a variation in conditions such as dampness, long grass, the current measurement figure will increase (caused by a drop off in voltage in the fence) leading to a signal mixed with the incoming voltage signal in mixer 14 which gives rise to a fall in the indicator reading. If this reading falls below a predetermined value the switching circuit 17 is switched to activate alarm 18. In any event the indicating device 15 gives the operator an indication of fence operation of low voltage acceptable and high voltage.

The monitoring device includes a resistance/capacitance amplifier detector circuit 20 for detecting a sudden decrease in current caused for example by a breakage in the fence. If the decrease is gradual, say by drying under the sun, the circuit does not operate.

Thus the monitoring system of the present invention indicates the effectiveness of the fence at a distance from the energizer as set or determined by the operator. However, the device can be connected and mounted in juxtaposition to the energizer without the need for reflectors or operating parts at remote parts of the fence. The exception to this is that it is preferable for a terminating resistor 30 to be inserted into the fence circuit at the end remote from the energizer to act as a passive load in the fence circuit. The value of the resistor 30 may be of the order of the natural impedance of the fence so that the value of the electrical pulse generated by the energizer will not be degraded. Thus the monitoring system will be sensitive to a fence breakage at a point near the remote end of the fence. This is because the termination resistor increases the total current in the system so that a breakage near the remote end of the fence will cause a sudden larger decrease in current which is easily detectable even in extremely lengthy fences of up to 40 or 50 kilometers or longer.

Thus the monitoring system of the invention includes three essential functions:

1. An indicator 15 for indicating the peak voltage in the wire at a predetermined distance from the energizer;
2. An alarm operable if the indicated peak voltage as said predetermined distance falls below a predetermined minimum; and
3. An alarm which detects a sudden short in the fence.

The functions are achieved without the need for reflectors or transponders in the fence remote from the energizer.

The circuits of the monitoring system will now be described in more detail having reference to the circuit diagrams in FIGS. 2 to 5.

Figure 2:
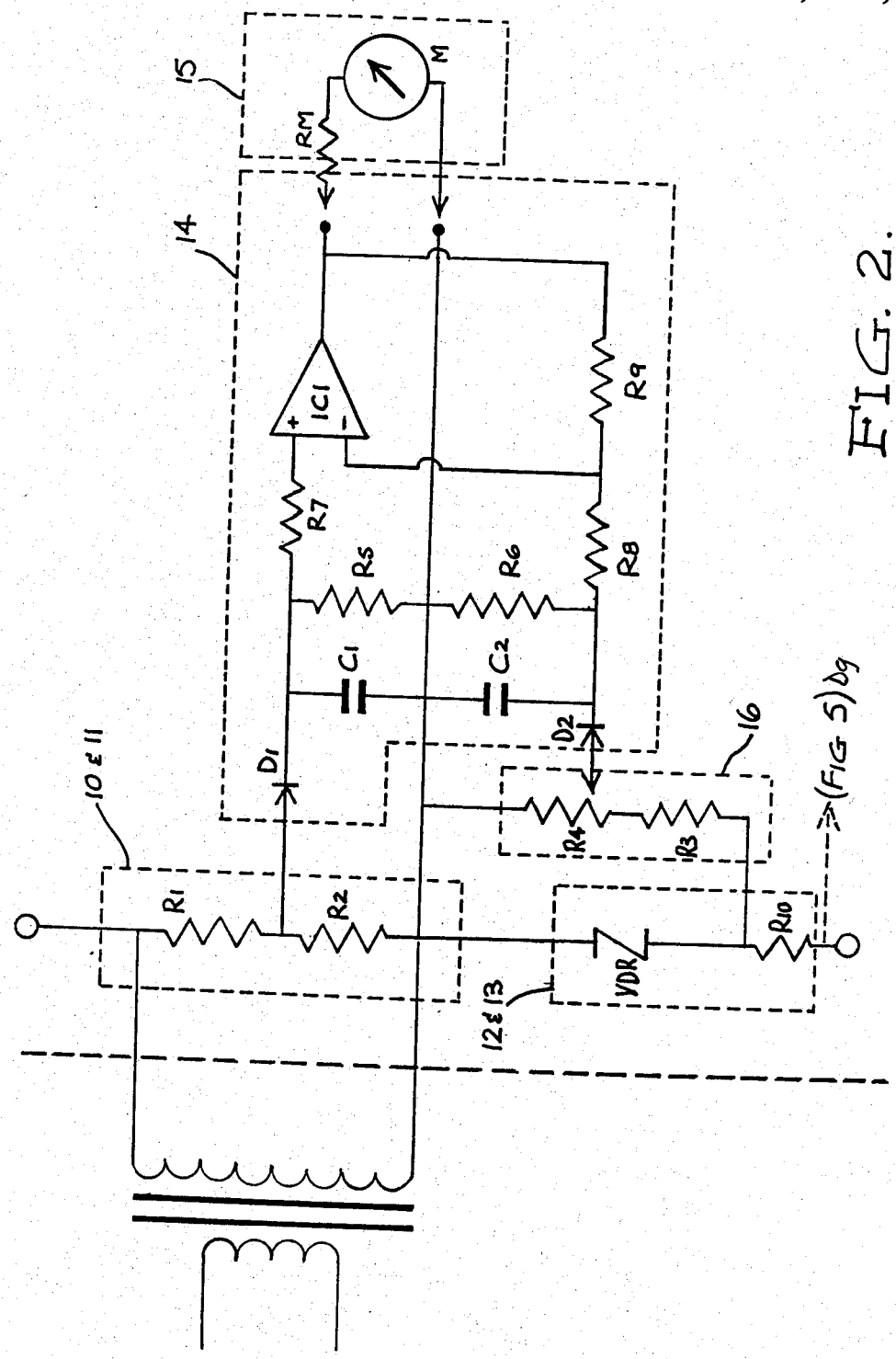
FIG. 2 shows details of voltage current measurement, curvature and mixing circuits.

One form of the alarm is shown in FIG. 2.

Across the output transformer of the fence energizer is connected two resistors in series R1 and R2 constituting voltage measurement and curvature circuits 10 and 11. Approximately 1/500 of the output pulse from the energizer appears across R2. This is rectified by diode D1 and charges up capacitor C1 which discharges very slowly through R5. The DC voltage appearing across $C_1, R5$ is proportional to the output voltage of the energizer. One end of the energizer output transformer is connected to the fence whilst the other is connected in series with V.D.R. (voltage dependant resistor) and R10 to the earth terminal to provide the current measurement and curvature circuits 12 and 13. The output pulse of the energizer causes current to pass into the fence via V.D.R. and R10. The voltage appearing across V.D.R. (due to the fence current) is divided by R3 and potentiometer R4 constituting the distance control circuit 16. This voltage is not linear to the current (distorted) because of the characteristic of the V.D.R. A portion of the voltage across R4 is selected by the tap and is rectified by $D_2$ and charges $C_2$ which very slowly discharges through R6. The voltage across R5 is connected via R7 to the positive input of the operational amplifier IC1. The voltage appearing across R6 is connected to the negative input of the same operational amplifier via R8. R8 and R9 form a negative feedback divider so that the operational amplifier operates with a small amount of gain. The result is the output of the amplifier is the difference of the two input signals multiplied by a small fixed factor representing the voltage of the fence energizer minus the current drop in the fence circuit. A volt meter Rm and M connected across the output of the operational amplifier can be made to indicate the value of the voltage that appears at some point or the end of the fence circuit by the adjustment of R4. As the fence circuit now changes its loading on the energizer by extra or less leakage (changes of current into the fence circuit) the output volt meter will also change and indicate the voltage to be found at the measuring point on the fence circuit. As the operational amplifier is fed with a single power supply its output cannot go below zero.

Figure 3:
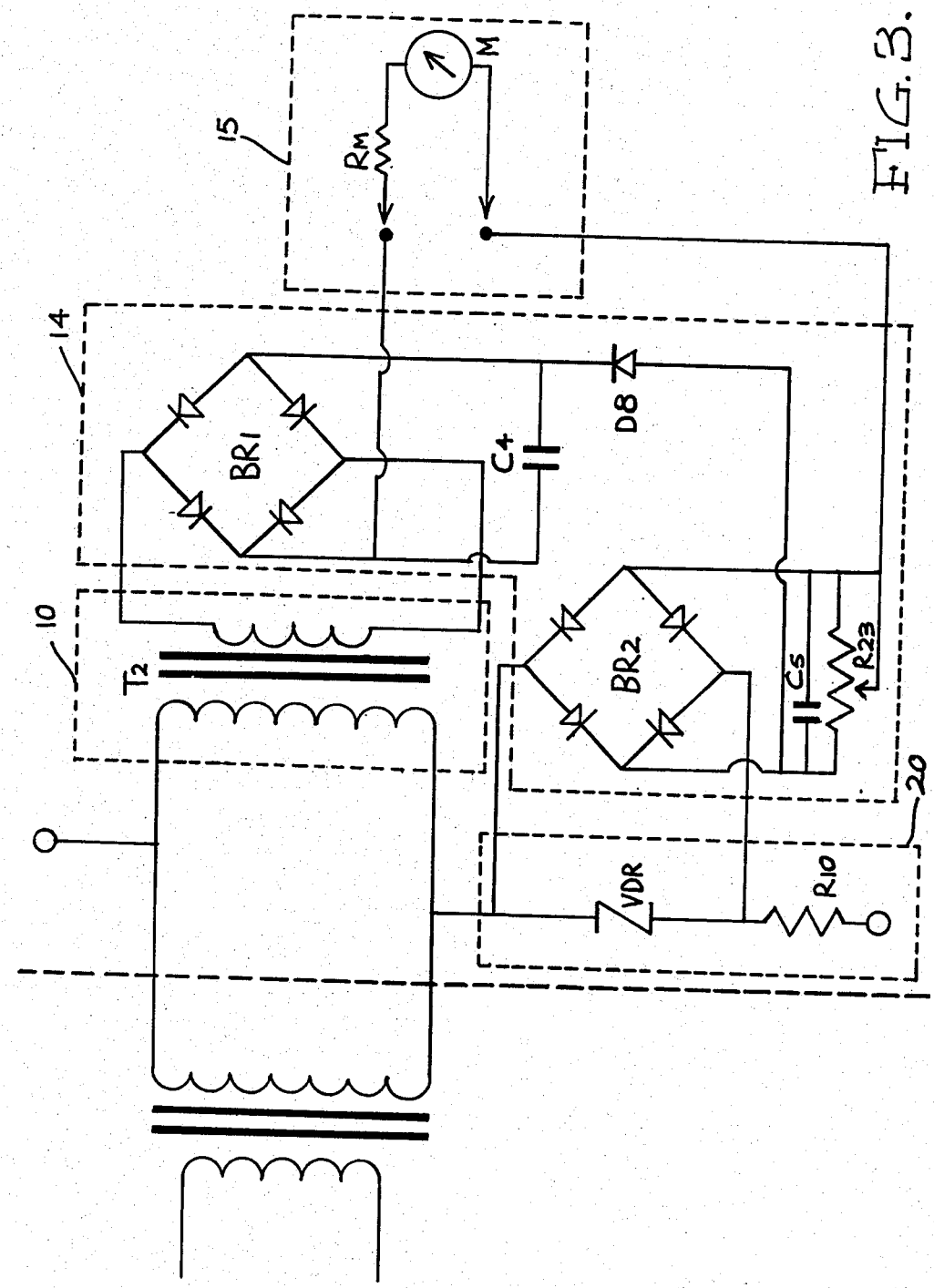
FIG. 3 shows an alternative mixing circuit.

A second form of the alarm is shown in FIG. 3.

A special high voltage transformer T2 is connected across the output of the fence energizer. This special high voltage transformer has a turns ratio of 1000 to 1 so that in its secondary 1/1000 of the output of energizer occurs. The secondary output is rectified by the bridge rectifier BR1 and charges capacitor $C_4$ to the peak secondary voltage. The output pulse of the energizer causes current to pass into the fence circuit via V.D.R. (voltage dependant resistor) and R10. The voltage appearing across V.D.R. is rectified via bridge rectifier BR2 and charges capacitor $C_5$. The potentiometer R23 connected across $C_5$ allows a portion of this voltage to be taped off. The voltages across $C_5$ and $C_4$ are connected together but opposing via D8. This allows an indicating volt meter (Rm,M) to be connected to the circuit reading the voltage across $C_4$ (the output voltage of the energizer) minus a portion of the voltage across $C_5$ (indicative of the current in the fence circuit). The volt meter can be made to indicate the measured voltage that appears at some point, or at the end of the fence circuit by adjusting potentiometer R23. As the fence circuit now changes its loading on the energizer by extra or less leakage (changes of current into the fence circuit), the output volt meter will also change and indicate the voltage to be found at the measuring point on the fence circuit. Diode D8 prevents the output voltage to fall below zero.

This circuit represents an alternative to FIG. 1 and has the following advantages:

(1) The output pulses from the energizer may be of either positive or negative polarity.
(2) If only an indicator is required (no alarm) no external power is required.
(3) It may be used also as a volt meter used at any point along the fence by adjusting R23 to zero or adding a switch to effectively do the same.
(4) An add on electronic alarm may be added at a later date.

This circuit has the disadvantage of using a special high voltage transformer.

Figure 4:
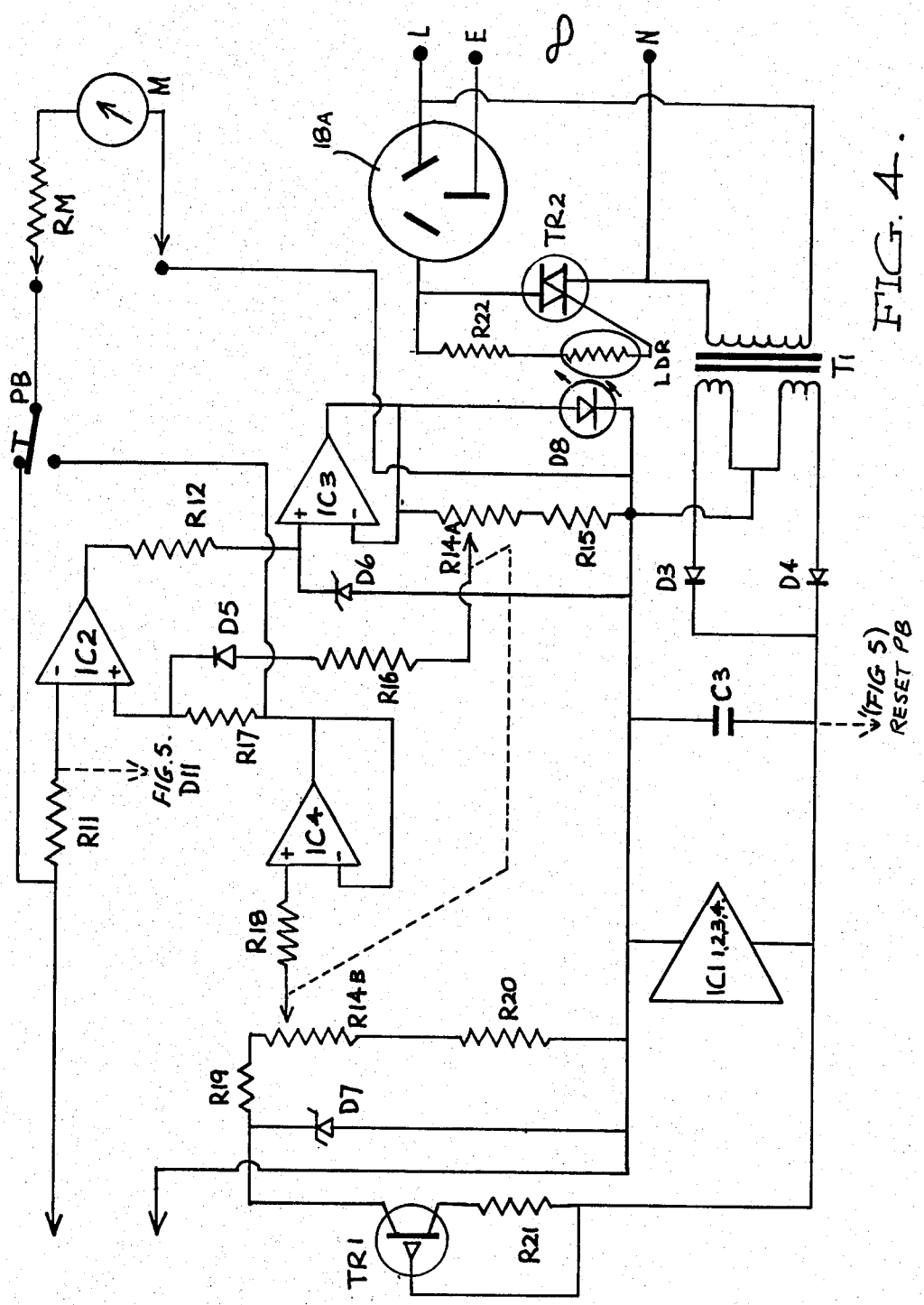
FIG. 4 shows a detailed switching circuit.

The output from the voltage measuring circuits may also be connected to a simple electronic voltage level switch shown in FIG. 4, constituting switch circuit 17, so that a voltage level may be set so that once the indicated voltage falls below the set point some alarm device (bell lights etc.) connected may operate bringing to the notice of the operator that this condition has occurred. The alarm may be connected to plug 18a.

A simple DC power supply is formed by T1, D3, D4, and $C_3$. This DC supply is connected across IC 1,2,3,4 and also a fixed current is supplied to D7 (zener diode) via the current regulator R21 and TR1 (junction field effect transistor). As D7 is supplied with a constant current not dependant on the power supply a constant voltage appears across R19, R14B and R20. A portion of this voltage across R20 and the tap of potentiometer R14B is connected via R18 to the positive input of operational amplifier IC4.

As the output of IC4 is connected directly to its own negative input its output voltage is exactly the input voltage at its positive input. The output of IC4 is also connected to the positive input of IC2 via R17. The output voltage of the previous described voltage measuring circuits (FIGS. 2 and 3) is connected via R11 to the negative input of IC2 (operating as a voltage comparator).

The output of IC2 will be zero if either the two input voltages are the same or if the voltage on the negative input is greater than the positive input. If the voltage of the positive input is greater than the voltage of the negative input the output voltage of IC2 will rise to nearly the same as the DC supply voltage to IC2. This output is connected via R12 to the positive input of the operational amplifier IC3.

Also connected to the positive input of IC3 is a zener diode D6 so that the input voltage to IC3 will not rise above the operating point of D6. As IC3 has its output also connected to its own negative input its output voltage is exactly the input voltage supplied to its positive input fixed to a peak value by zener diode D6.

The voltage output of IC3 causes current to flow through R13 and the light emitting diode D8 which is optically coupled to the light dependant resistor LDR. When light falls upon LDR current flows via R22 into the gate of the triac TR2 thus causing current to flow from the electrical supply through the alarm connected via the alarm socket. The output voltage from IC3 also causes current to flow through R14A and R15. Because the values of D6 and D7 (which are the same) and R19, R14B, R20 and R14A,R15 the voltage across the tap of potentiometer R14A and R15 will be greater than the voltage across the tap of potentiometer R14B and R20 (R14A and R14B are mechanically connected together) when IC2 and IC3 have an output voltage. This causes a current to flow via R16 and D5 into the positive input of IC2 thus providing positive feedback. This positive feedback which is constant regardless of the position of the coupled potentiometers R14A and B causes hysteresis so that positive switching of IC2 occurs. The amount of positive feedback is sufficient to cause reliable switching to occur with minimal dead band. An indicating volt meter (Rm,M) may be connected to the two inputs to the IC2 via a changeover push button PB so that in the normal position it indicates the voltage on the fence but when pushed the volt meter indicates the "set" voltage set by the position of R14B that the alarm will operate at. As the volt meter is connected to low impedance sources it has no loading effect on the circuit. As the operational amplifiers IC1, 2,3,4 and the voltage reference D7 are independant of the supply voltage (within limits) the circuit will operate with a ten fold change in supply voltage.

Figure 5:
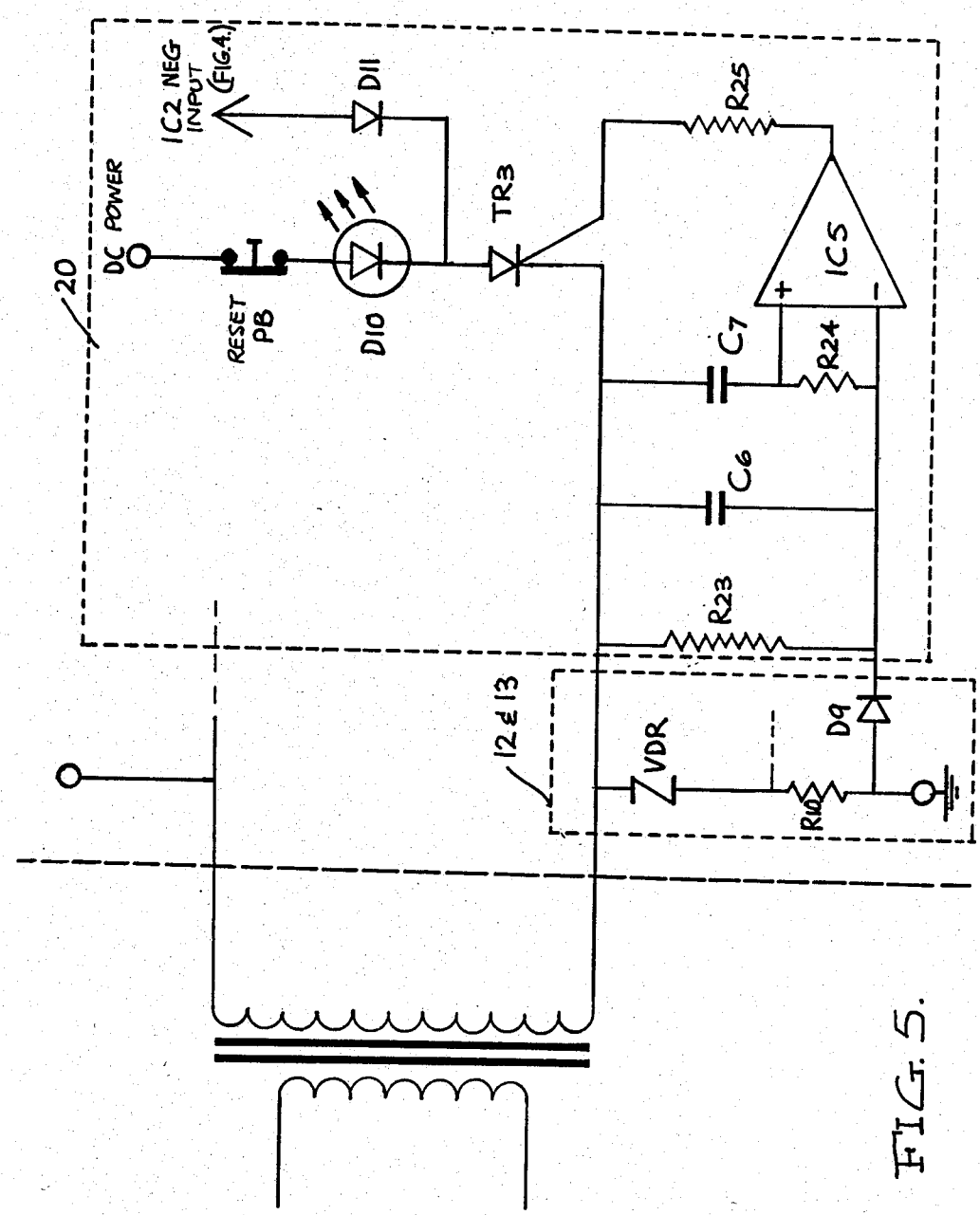
FIG. 5 shows details of a detector circuit.

By the addition of the detector circuit 20 shown in FIG. 5 the alarm will also be activated should a break occur in the wire of the fence circuit. A break in the fence circuit is a sudden occurrence and is detected by a sudden decrease in the fence circuit current. This will be different from a decrease in the fence circuit current by natural causes as these occur much slower (wet fence drying in the sun etc.). As stated in the circuits of FIGS. 3 and 4 the fence circuit current causes a voltage drop across V.D.R. and R10. Small charges in current cause a much larger charge in voltage across R10 then V.D.R. It is also desirable but not necessary to place at all ends of each fence wire a terminating load. This will cause a definite fence circuit current associated with the end of each fence wire. Should only a very short piece of wire be broken off a very long fence it will be detected easily. This terminating load may be many more times the natural impedance of the fence so that no degradation of the system will result due to their use.

The voltage across R10 and V.D.R. is rectified by D9 and charges $C_6$. $C_7$ is also charged but through R24. $C_6$ discharges through R23 but $C_7$ must discharge through R23 and R24 so that the time constant for $C_7$, R23 and R24 is much larger. $C_6$ is connected to the negative input of the operational amplifier IC5 while $C_7$ is connected to the positive input.

The output of IC5 remains zero unless the voltage on $C_7$ is larger than the voltage on $C_6$. This occurs when there is a sudden decrease in the current in the fence circuit because of the different discharging time constants of $C_6$ and $C_7$. The output of IC5 is connected via R25 to the gate of a small silicon controlled rectifier TR3 which latches into conduction. The current passing from the alarm system power supply through the high voltage fixed current light emitting diode D10 causes TR3 to remain switched on. TR3 remains conducting until IC5 has no output and the reset (RESET PB) is operated. As diode D11 is connected to the negative input of IC2 (FIG. 4) TR3 also forces IC2 into operation by forcing the negative input of IC2 to a low potential. This causes the alarm circuit to operate until TR3 is reset to the non-conducting state. Light emitting diode D10 indicates to the operator when the alarm operates that the fault condition is a breakage in the fence circuit.

What we claim is:

1. A monitoring system for an electric fence having energizer means for applying an electric pulse of a certain magnitude to a long fence conductor near one end thereof, said long fence conductor forming the electric fence, and being adapted to cooperate with an indicating device, said long fence conductor having a remote end opposite said one end, said system comprising a voltage sensor for sensing and measuring voltage on the conductor with respect to a voltage reference point, a current sensor for sensing and measuring current flow in the conductor, the values of voltage and current sensed being related to the magnitude of the electric pulse in the conductor, and being normally within a predetermined range of values, a curvature circuit connected to said sensors for linearizing the measured voltage and current, and a mixer circuit for receiving the linearized values of the voltage and the current, and for providing an output indicative of an apparent voltage level at the remote end of said long fence conductor, said sensors, said curvature circuit, and said mixer circuit being located in proximity to said energizer means, said indicating device being arranged to receive and measure said output in the vicinity of said mixer circuit, to provide from said output at any instant a measurement of said apparent voltage level at the remote end of said long fence conductor, and to operate alarm means when said values fall outside said predetermined range of values.

2. The monitoring system as claimed in claim 1, wherein said voltage reference point is ground.

3. The monitoring system as claimed in claim 1, further comprising means for sensing a relatively rapid change in the current of the pulse.

4. The monitoring system as claimed in claim 1, further comprising a terminating load connected to said conductor near said remote end.

5. The monitoring system as claimed in claim 4, wherein said fence has a natural impedance, and wherein said terminating load is at least equal in magnitude to said natural impedance.

6. A monitoring system for an electric fence having energizer means for applying an electric pulse of a certain magnitude to a long fence conductor near one end thereof, said long fence conductor forming the electric fence, and having a remote end opposite said one end, said system comprising a voltage sensor for sensing and measuring voltage on the conductor with respect to a voltage reference point, a current sensor for sensing and measuring current flow in the conductor, the values of voltage and current sensed being related to the magnitude of the electric pulse in the conductor, and being normally within a predetermined range of values, a curvature circuit connected to said sensors for linearizing the measured voltage and current, a mixer circuit for receiving the linearized values of the voltage and the current, and for providing an output indicative of an apparent voltage level at the remote end of said long fence conductor, said sensors, said curvature circuit, and said mixer circuit being located in proximity to said energizer means, and indicating means arranged to receive and measure said output in the vicinity of said mixer circuit, to provide from said output at any instant a measurement of said apparent voltage level at the remote end of said long fence conductor, and being adapted to operate alarm means when said values fall outside said predetermined range of values.

7. The monitoring system as claimed in claim 6, further comprising means for sensing a rapid change in the current of the pulse.

* * * * *